(12) United States Patent
Park (10) Patent No.: US 6,580,649 B2
(45) Date of Patent: Jun. 17, 2003

(54) SEMICONDUCTOR MEMORY DEVICE (75) Inventor: Jong-Hun Park, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/038,720

(22) Filed: Jan. 8, 2002

(65) Prior Publication Data

US 2003/0086304 A1 May 8, 2003

(30) Foreign Application Priority Data

Nov. 2, 2001 (KR) .................. 10-2001-0069131

(51) Int. Cl.⁷ .................................................. G11C 7/00
(52) U.S. Cl. .................... 365/189.07; 365/210
(58) Field of Search ................ 365/189.07, 210

(56) References Cited

U.S. PATENT DOCUMENTS

| 4,989,182 A | | 1/1991 | Mochizuki et al. |
| 5,010,518 A | * | 4/1991 | Toda ........................ 365/210 |
| 5,031,153 A | | 7/1991 | Suyama |
| 5,245,584 A | | 9/1993 | Zampaglione et al. |
| 5,596,539 A | | 1/1997 | Passow et al. |
| 5,694,369 A | | 12/1997 | Abe |
| 5,768,204 A | | 6/1998 | Muraoka |
| 5,881,008 A | | 3/1999 | Becker |
| 6,026,042 A | | 2/2000 | Shirley et al. |
| 6,088,279 A | | 7/2000 | Ishii |
| 6,097,654 A | | 8/2000 | Kikuchi |
| 6,144,600 A | * | 11/2000 | Ogura ........................ 365/210 |
| 6,181,626 B1 | | 1/2001 | Brown |
| 6,185,135 B1 | | 2/2001 | Netis et al. |

FOREIGN PATENT DOCUMENTS

| JP | 59-168991 | 9/1984 | ........... G11C/11/34 |
| JP | 04-079095 | 3/1992 | ......... G11C/11/401 |
| JP | 06-176568 | 6/1994 | ......... G11C/11/407 |
| JP | 07-211073 | 8/1995 | ........... G11C/11/41 |
| JP | 07-272484 | 10/1995 | ......... G11C/11/409 |
| JP | 10-199280 | 7/1998 | ........... G11C/16/06 |
| JP | 11-328970 | 11/1999 | ........... G11C/11/41 |

* cited by examiner

Primary Examiner—Huan Hoang
(74) Attorney, Agent, or Firm—Jacobson Holman PLLC (57) ABSTRACT A semiconductor memory device comprising a plurality of dummy wordlines independently formed with a plurality of normal wordlines, a plurality of dummy wordline drivers for driving the plurality of dummy wordlines, a plurality of control circuits for controlling the plurality of dummy wordline drivers, a plurality of comparing units for comparing a voltage level of the dummy wordline and the predetermined reference voltage level and a plurality of outputting units for outputting signals outputted from the plurality of comparing units.

20 Claims, 7 Drawing Sheets

SEMICONDUCTOR MEMORY DEVICE

FIELD OF THE INVENTION

The present invention relates to a semiconductor memory device; and, more particularly, to a semiconductor memory device having a monitoring device capable of measuring the line delay or a model parameter of a wordline or a bitline.

DESCRIPTION OF THE PRIOR ART

As the integration density of a semiconductor memory device increases, the RC delay and a model parameter of a wordline or a bitline have a significant effect on a semiconductor memory device characteristic. The RC delay and the model parameter are important factors to accurately set timing in an internal operation and to determine whether the goods are commercially competitive. However, there are few methods capable of reliably measuring the RC delay and the model parameter. A method, which is currently in use to measure the line delay, is not a direct measurement, but an indirect measurement so that an accurate measurement cannot be performed.

Figure 1:
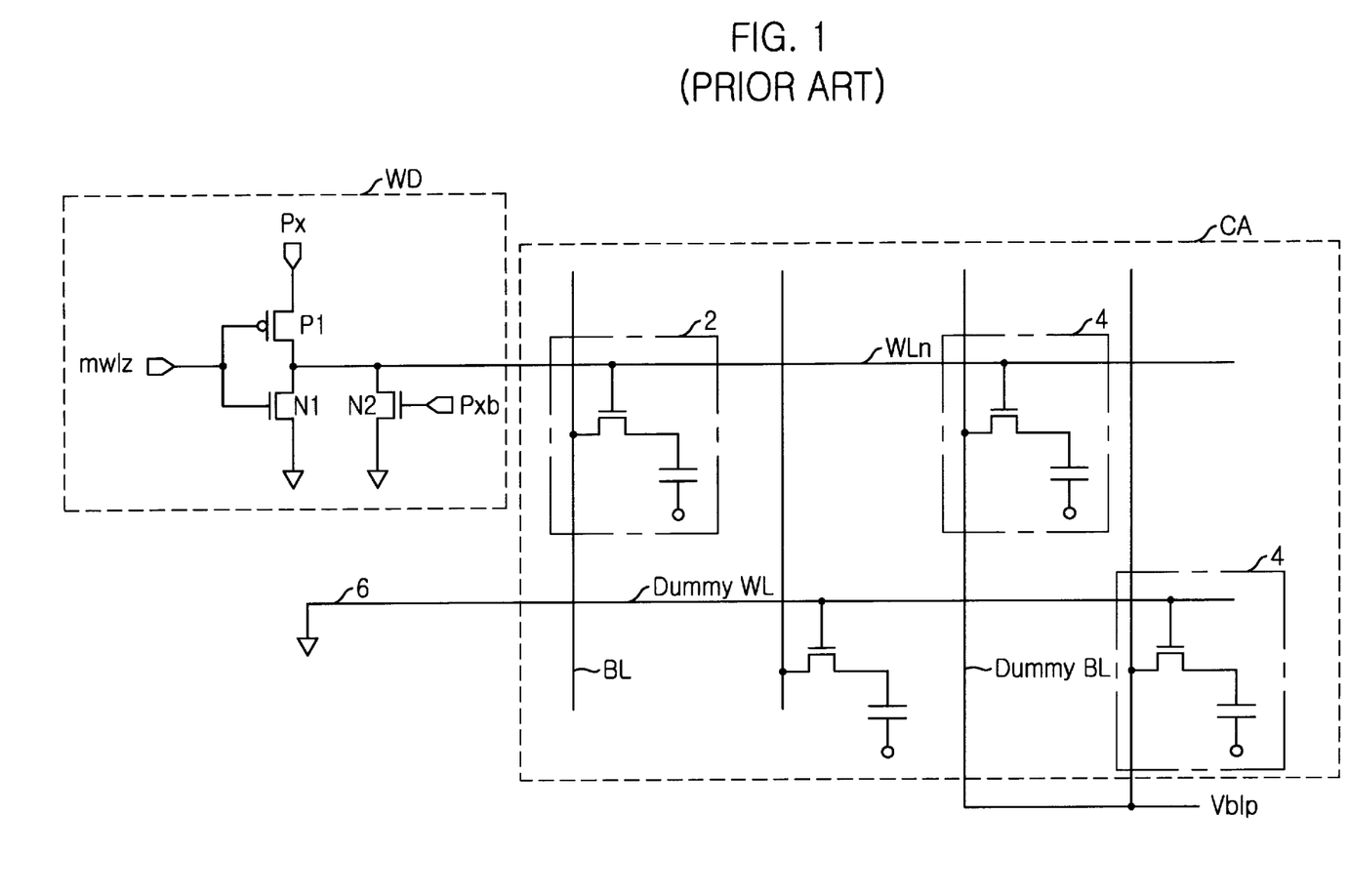
FIG. 1 is a schematic circuit diagram showing a memory cell of the semiconductor memory device according to the prior art.

FIG. 1 is a schematic circuit diagram showing a portion of cell block in a DRAM according to the prior art.

Referring to FIG. 1, a wordline driver WD is driven in response to a main wordline enable bar signal mwlz outputted from a row decoder (not shown) and a wordline boosting signal Px is applied to a wordline WLn connected to a memory cell 2 by the wordline driver WD. Generally, a dummy wordline and a dummy memory cell, which have the same width and area as the normal wordline and the normal memory cell, are configured at the edge of the normal wordline WLn for stability of a process.

The main wordline signal is selected by a row address and one normal wordline boosting signal Px is selected from Px0 to Px3 by the address signal and then a voltage level of the normal wordline WLn is changed into a boosting voltage Vpp level, which is higher than a power supply voltage level. One wordline WLn is driven to the boosting voltage Vpp level in response to the main wordline signal. At this time, the dummy wordline is not used so that the voltage level of the dummy wordline is fixed to a ground voltage level. Also, a dummy bitline voltage level is set to a Vblp level, which is a bitline precharge voltage level.

In the above configuration, after manufacturing real goods, a characteristic of the goods is determined by how rapidly the voltage level of the wordline WLn or the bitline BL increases to a desired voltage level. It is very important to determine whether the enable time of a bitline sense amplifier, a tRCD_min and a model parameter are matched with those of an actual device. However, an accurate measurement method has not been implemented in the prior art. A conventional measurement method is to measure a data line, which can be measured because the data line is a metal line, and indirectly guess the desired data, so that accurate data cannot be obtained.

SUMMARY OF THE INVENTION

It is, therefore, an object of the present invention to provide a semiconductor memory device having a monitoring circuit capable of measuring the line delay or a model parameter of a wordline or a bitline.

In accordance with an aspect of the present invention, there is provided a semiconductor memory device comprising: a plurality of dummy wordlines independently formed with a plurality of normal wordlines; a plurality of dummy wordline drivers for driving the plurality of dummy wordlines; a plurality of control circuits for controlling the plurality of dummy wordline drivers; a plurality of comparing means for comparing a voltage level of the dummy wordline and the predetermined reference voltage level; and a plurality of outputting means for outputting signals outputted from the plurality of comparing means.

In accordance with another aspect of the present invention, there is provided a semiconductor memory device comprising: a plurality of dummy bitlines independently formed with a plurality of normal bitlines; a plurality of dummy bitline drivers for driving the plurality of dummy bitlines; a plurality of control circuits for controlling the plurality of dummy bitline drivers; a plurality of comparing means for comparing a voltage level of the dummy bitline and the predetermined reference voltage level; and a plurality of outputting means for outputting signals outputted from the plurality of comparing means.

In accordance with a still further aspect of the present invention, there is provided a semiconductor memory device comprising; a plurality of dummy wordlines independently formed with a plurality of normal wordlines; a plurality of normal bitlines independently formed with a plurality of normal bitlines; a monitoring means for measuring voltage on the dummy bitline or the dummy wordline; and a control circuit for controlling the monitoring means.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a semiconductor memory device having a monitoring circuit capable of measuring the line delay and a model parameter of a wordline or a bitline according to the present invention will be described in detail referring to the accompanying drawings.

Figure 2:
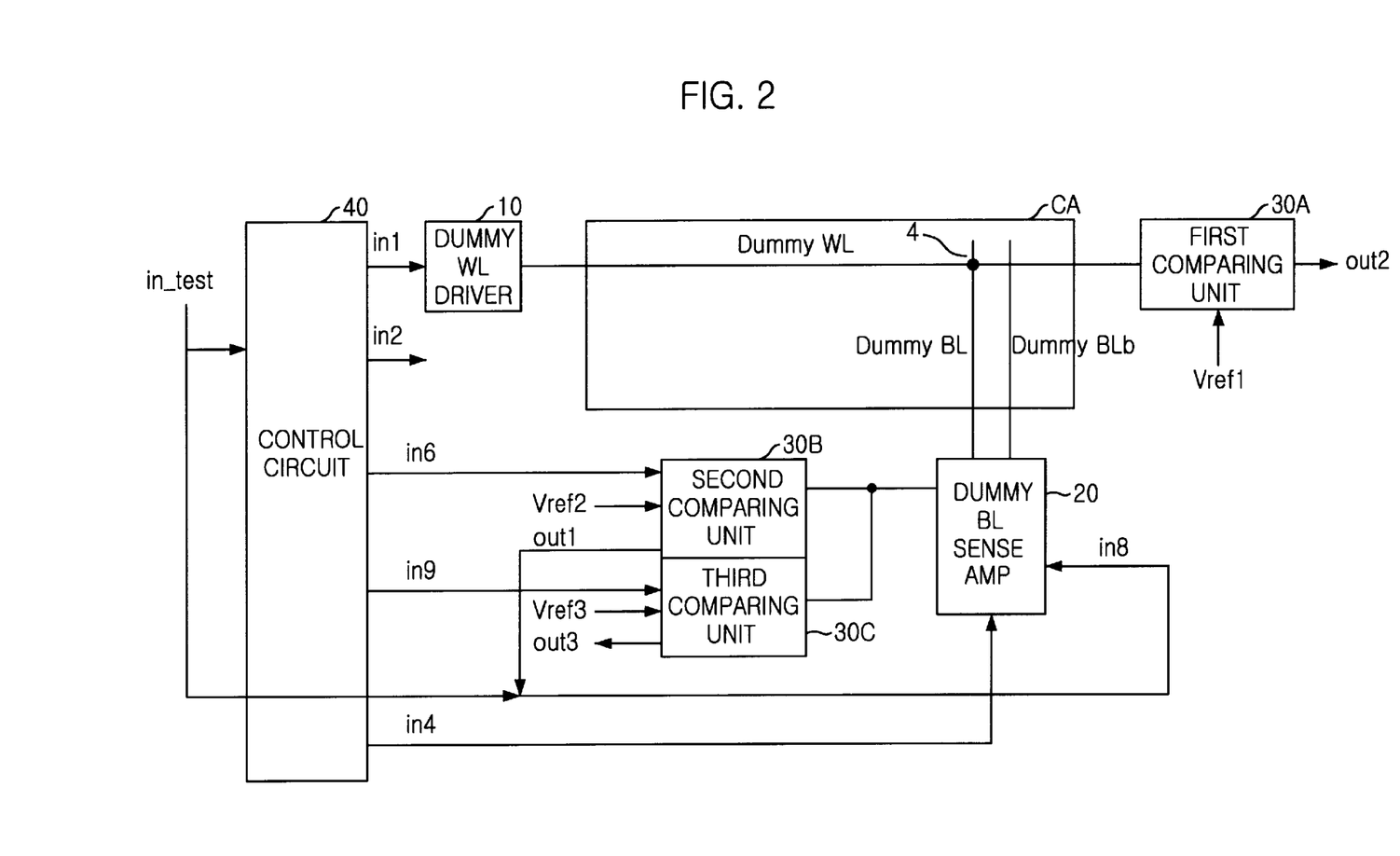
FIG. 2 is a schematic circuit diagram showing a semiconductor memory device having a monitoring circuit according to the present invention.

FIG. 2 is a schematic block diagram showing a semiconductor memory device having a monitoring circuit according to the present invention.

Referring to FIG. 2, the semiconductor memory device includes a wordline monitoring circuit and a bitline monitoring circuit. The semiconductor memory device can have only the wordline monitoring circuit or the bitline monitoring circuit according to a chip design or the like. The semiconductor memory device having two monitoring circuits will now be described.

The semiconductor memory device includes a cell array CA having a plurality of dummy memory cells (not shown), a plurality of normal wordlines, a plurality of dummy wordlines BL, BLb connected to the dummy memory cells, a plurality of normal bitlines, a plurality of dummy bitlines connected to the dummy memory cells, a dummy wordline driver 10, a dummy bitline sense amplifier 20, a first comparing unit 30A, a second comparing unit 30B, a third comparing unit 30C and a control circuit 40.

The dummy bitline sense amplifier 20 amplifies data on the dummy bitline and the first comparing unit 30A compares voltage of the dummy bitline with a first referent voltage Vref1. The second comparing unit 30B compares voltage of the dummy bitline with a second referent voltage Vref2 and the third comparing unit 30C compares voltage of the dummy bitline with a third reference voltage Vref3. The control circuit 40 generates a plurality of control signals to control that measures voltage of the dummy bitline.

The monitoring circuit according to the present invention includes the dummy wordline driver 10, the dummy bitline sense amplifier 20, the first, second and third comparing units 30A, 30B and 30C and the control circuit 40 shown in FIG. 2. The control circuit 40 generates a plurality of control signals in1, in2, in4, in6, in8, and in9 to control the dummy wordline driver 10, the dummy bitline sense amplifier 20 and the first, second and third comparing units 30A, 30B and 30C.

Output signals out1, out2 and out3 of the second, first, and third comparing units 30B, 30A, and 30C, respectively, which are measured values in the monitoring circuit, are transferred into external circuits of the chip through terminals or pads.

Figure 3:
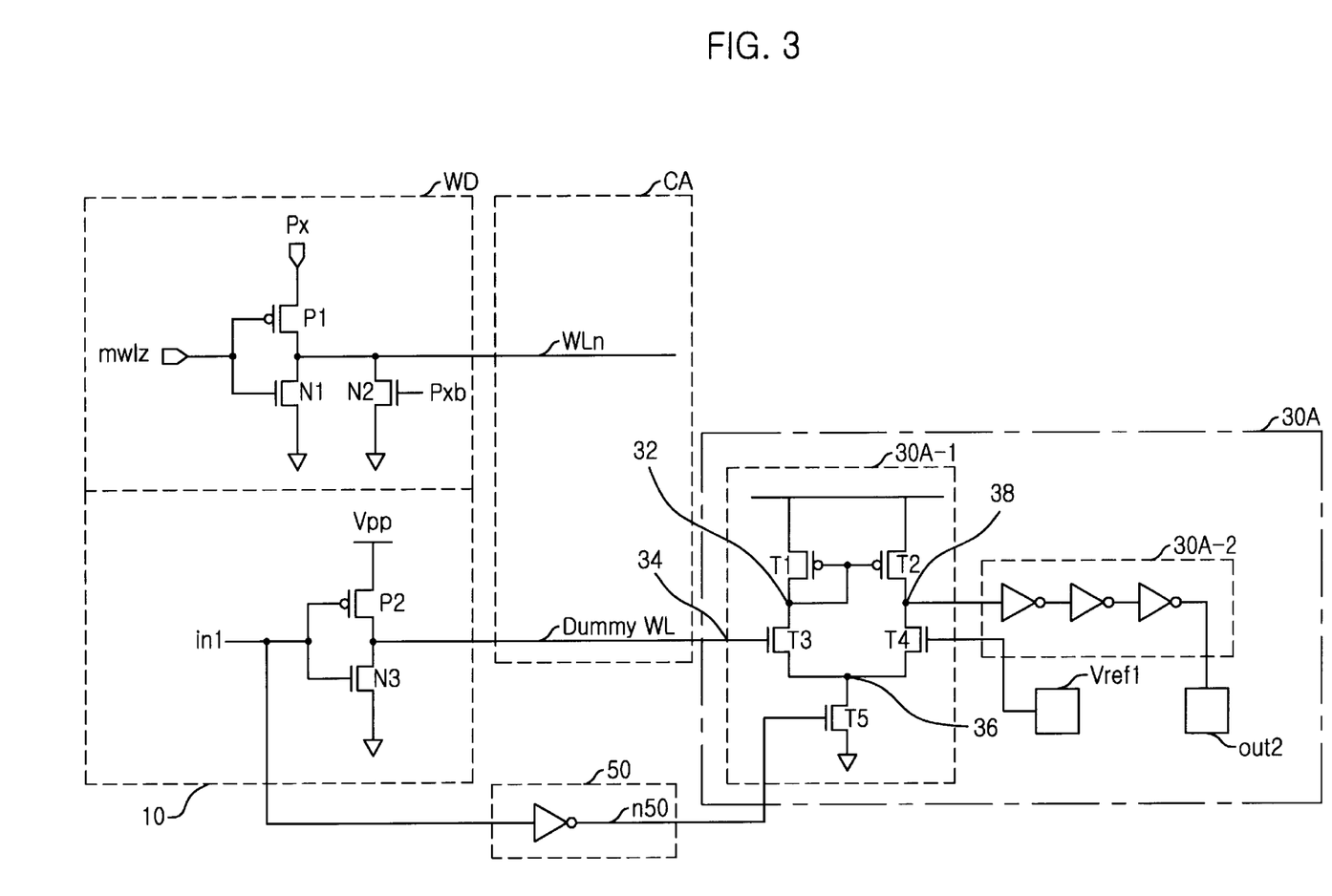
FIG. 3 is a detailed circuit diagram showing the monitoring circuit of the semiconductor memory device of FIG. 2 according to the present invention.

FIG. 3 is a detailed circuit diagram showing a monitoring circuit to measure the wordline delay in FIG. 2.

Referring to FIG. 3, the monitoring circuit includes a cell array CA, a wordline driver WD, a dummy wordline driver 10, a first comparing unit 30A and a driving unit 50. The wordline driver WD drives a normal wordline WLn in the cell array CA and the dummy wordline driver 10 drives a dummy wordline in the cell array CA in response to a control signal in1 of the control circuit 40 shown in FIG. 2. The first comparing unit 30A compares the voltage level of the dummy wordline with a first reference voltage Vref1 level and the driving unit 50 drives the first comparing unit 30A in response to the control signal in1.

It is preferable that CMOS transistors P2 and N3 in the dummy wordline driver 10 are the same size as CMOS transistors P1 and N1 in the normal wordline driver WD to obtain accurate data in measuring the normal wordline.

The voltage level applied to the dummy word line driver 10 is the boosting voltage Vpp level, which is the same as the voltage level of the normal wordline boosting signal Px. The first comparing unit 30A includes a differential amplifier 30A-1 and a driver 30A-2. The differential amplifier 30A-1 receives inputs of the dummy wordline signal and first reference voltage Vref in response to the control signal in1 and the driver 30A-2 amplifies and outputs an output signal of the differential amplifier 30A-1. The differential amplifier 30A-1 is a conventional differential amplifier and the driver 30A-2 includes three CMOS inverters connected in series.

Figure 4:
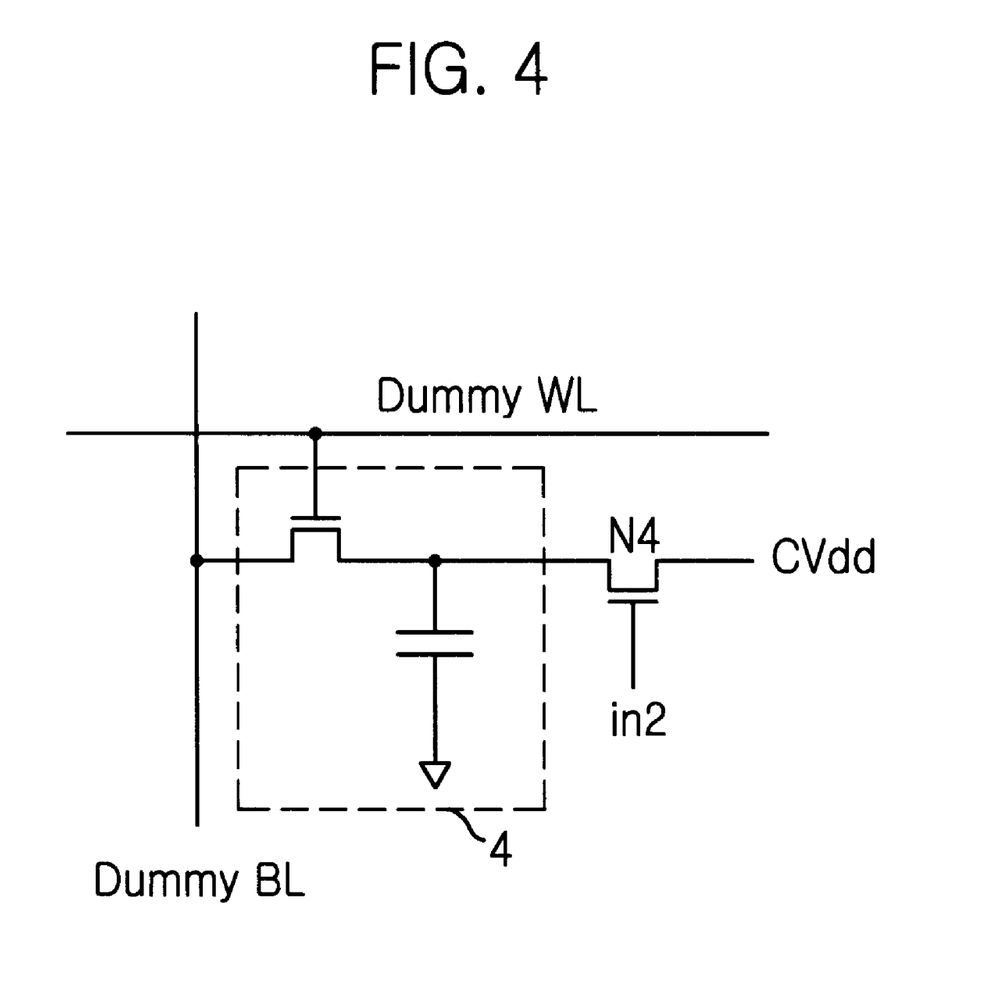
FIG. 4 is a circuit diagram showing a dummy memory cell of the semiconductor memory device of FIG. 2 according to the present invention.

FIG. 4 is a detailed circuit diagram showing a dummy cell 4 for measurement in FIG. 2. The dummy cell 4 is a conventional dummy cell of DRAM and additionally includes an NMOS transistor N4 controlled in response to a control signal in2, which is an output signal of the control circuit 40 and is activated in a measurement mode. Power supply voltage CVdd is applied to the dummy cell 4 through the NMOS transistor N4. When the control signal in2 is activated, data of a logic 'high' level, which is the CVdd level, is written in the dummy cell 4.

Figure 5:
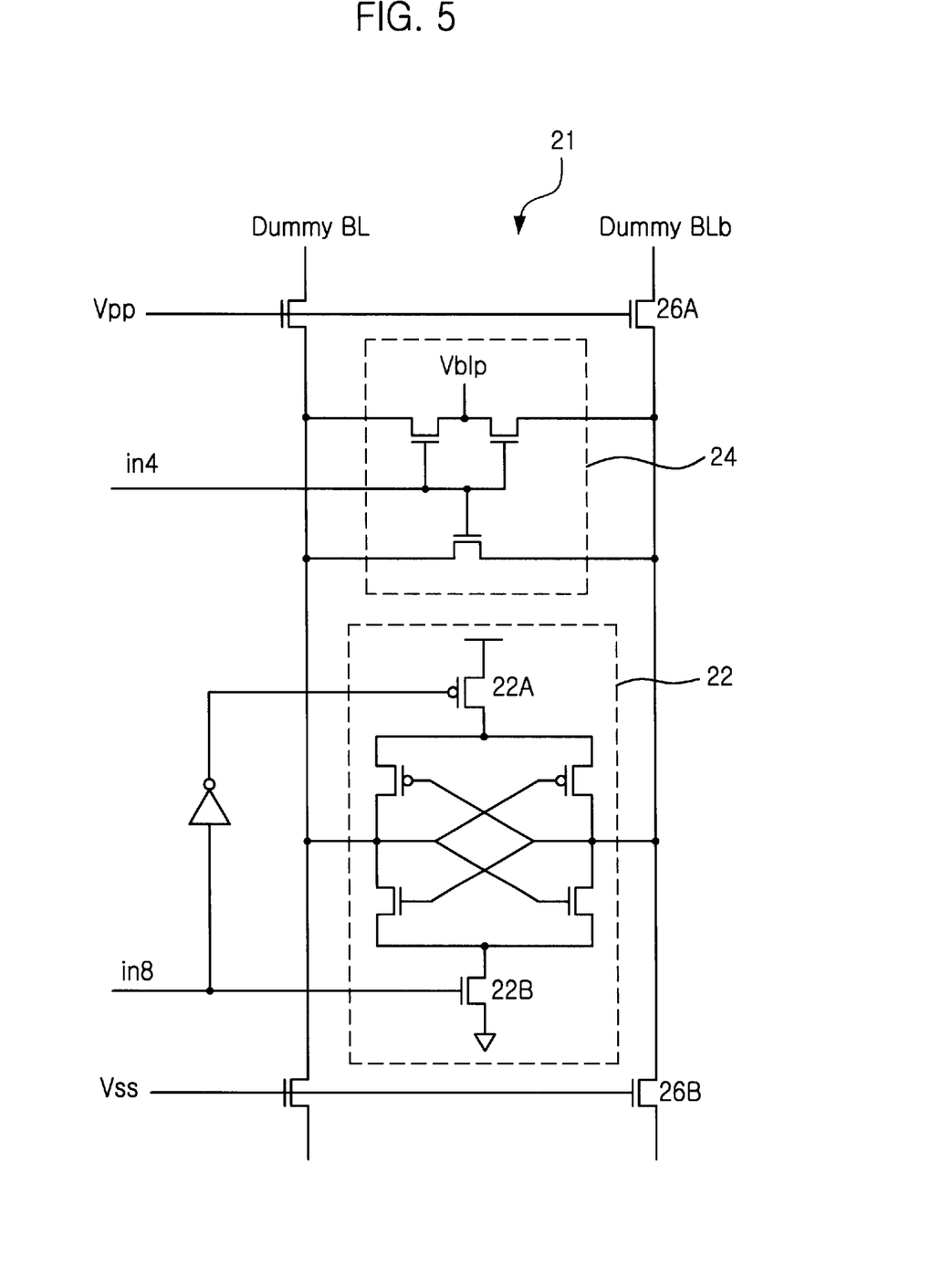
FIG. 5 is a circuit diagram showing a dummy bitline sense amplifier of the semiconductor memory device of FIG. 2 according to the present invention.

FIG. 5 is a detailed circuit diagram showing the dummy bitline sense amplifier 20 shown in FIG. 2. The bitline sense amplifier 20 is operated in the same manner as a normal bitline sense amplifier and is controlled in response to control signals outputted from the control circuit 40 so that an accurate measurement of a delay of the dummy bitline sense amplifier 20 is carried out in the same way as that of the normal bitline sense amplifier. The dummy bitline sense amplifier 20 includes a sense amplifying unit 22, a precharging unit 24 and isolation transistors 26A and 26B. The sense amplifying unit 22 amplifies data on a pair of dummy bitlines BL and BLb and the precharging unit 24 precharges and equalizes the pair of dummy bitlines. The isolation transistors 26A and 26B isolate the pair of dummy bitlines BL and BLb connected to the dummy cell 4 from the pair of dummy bitlines BL and BLb connected to the dummy sense amplifier 22 in a sensing operation.

Referring to FIG. 5, the dummy bitline sense amplifier 22 is operated in response to the control signal in8. The dummy bitline sense amplifier 22 is operated in the same manner as a common bitline sense amplifier in its sensing and precharging operations.

Figure 6:
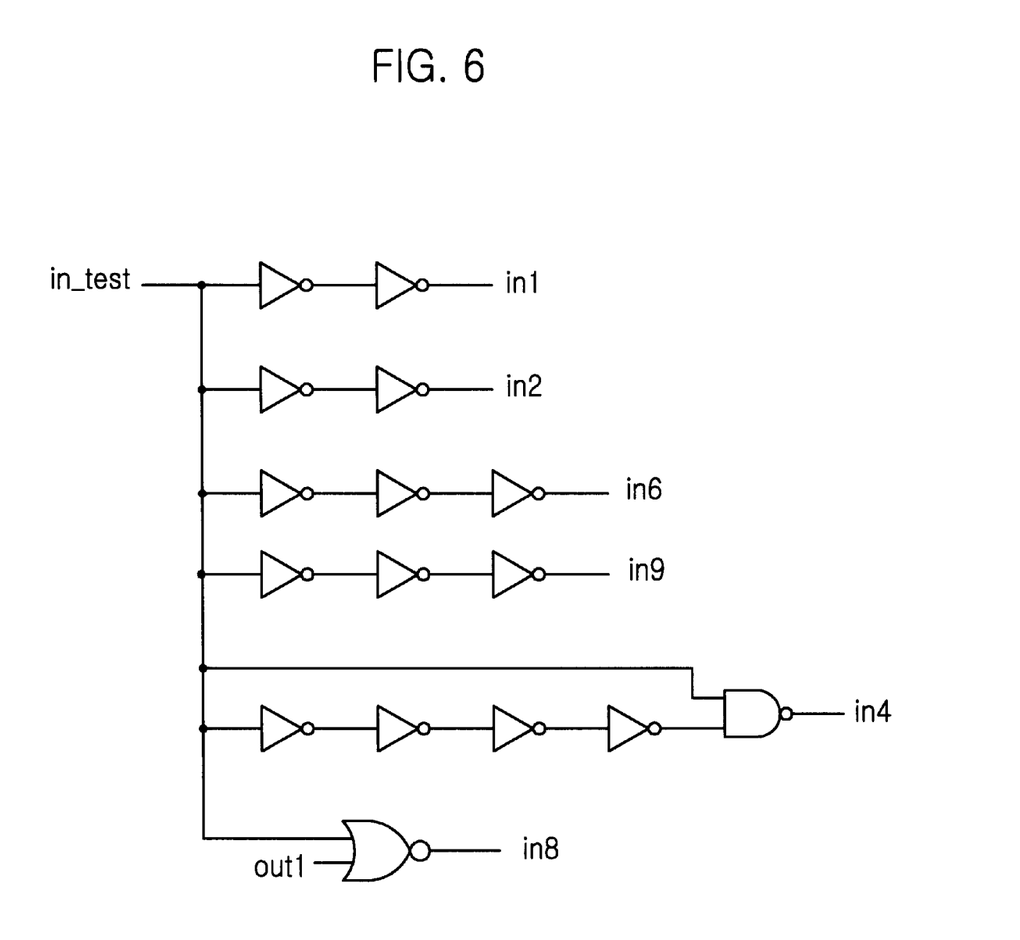
FIG. 6 is a circuit diagram showing a control circuit of the semiconductor memory device of FIG. 2 according to the present invention.

FIG. 6 is a detailed circuit diagram showing the control circuit 40, that is, a timing signal generating circuit, shown in FIG. 2. A signal in_test is enabled in a specific mode, such as a special test mode or the like, and then disabled after tRAS.

Referring to FIG. 6, the control circuit 40 generates control signals in1, in2, in4, in6, in8 and in9 in a test mode.

Figure 7:
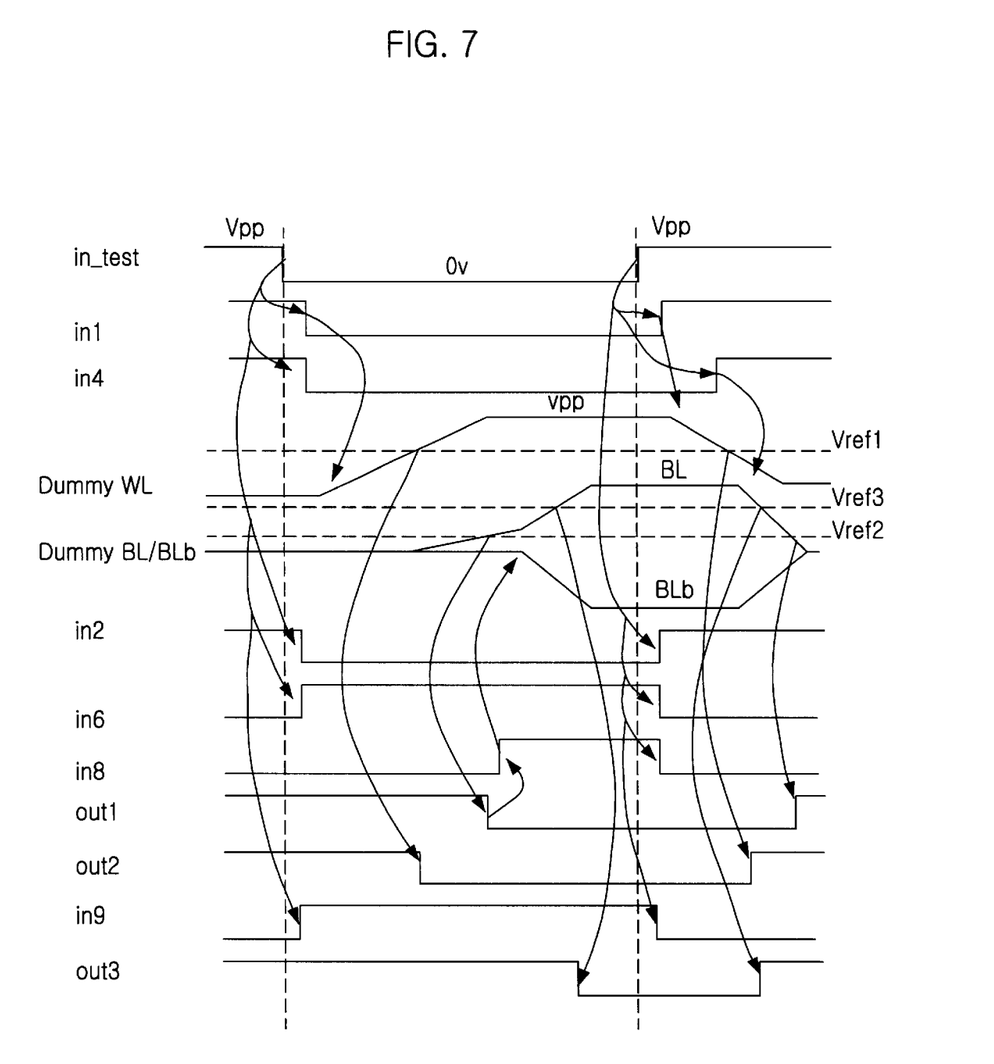
FIG. 7 is a timing diagram of the semiconductor memory device of FIG. 2 according to the present invention.

FIG. 7 is a timing diagram of FIG. 2.

Referring to FIG. 7, when the control signal in1 is generated in response to the in_test signal, which is activated in the test mode, the dummy wordline driver 10 shown in FIG. 3 is driven so that the dummy wordline WL is driven to a level Vpp. At this time, the fist comparing unit 30A compares the voltage level of the dummy wordline WD with a first reference voltage Vref1 level. When the voltage level of the dummy wordline WL becomes higher than the first reference voltage Vref1 level, the voltage level of an output node 38 of the differential amplifier 30A-1 moves from a logic 'high' level to a logic 'low' level. Before the control signal in1 is enabled, the first reference voltage Vref1 is higher than the voltage level of the dummy wordline WD so that the voltage level of the output node 38 is maintained with a logic 'high' level.

The operation of the differential amplifier 30A-1 will now be described in detail.

When an output node n50 is set at a logic 'high' level by the driving unit 50 of the differential amplifier 30A-1, a current on node 36 starts to flow into a ground. Two PMOS transistors T1 and T2, which are in the differential amplifier 30A-1, are the same size and two NMOS transistors T3 and T4, which are also in the differential amplifier 30A-1, and are also the same, so that the two PMOS transistors T1 and T2 drive a uniform current independent of voltage applied to nodes 32 and 38.

When the dummy wordline driver 10 is operated in response to the control signal in1, a current flowing through the NMOS transistor T4 is greater than that through the NMOS transistor T3 in the initial operation, which means that the voltage level of the dummy wordline is less than the first reference voltage Vref1 level, because the NMOS transistor T4 is more highly biased than the NMOS transistor T3. The node 38 reaches a logic 'low' level more quickly than the node 32. Since the voltage level of the node 32 is high, the gate voltage level of the PMOS transistors T1 and T2 is high so that the current flowing through the PMOS transistors T1 and T2 is reduced. Accordingly, the voltage level of the node 38, which is the output node of the differential amplifier 30A-1, becomes a logic 'low' level.

Subsequently, when the voltage level of the dummy wordline increases and becomes higher than the first reference voltage Vref1 level, the NMOS transistor T3 is more highly biased than the NMOS transistor T4 so that the voltage level of the node 32 moves to a logic 'low' level. Namely, the drivability of the PMOS transistor T2 becomes higher than that of the NMOS transistor T4 so that the voltage level of the output node 38 moves to a logic 'high' level.

Since the output signal of the output node 38 in the differential amplifier 30A-1 is relatively weak, the output signal has to be amplified for measurement through a measurement pad out2. The driver 30A-2 functions to the output signal of the differential amplifier 30A-1. Also, if the first comparing unit 30A of FIG. 3 is successively operated in a normal mode, the stand-by current increases. In order that the first comparing unit 30A is turned off during normal operation and is turned on while the dummy wordline is being driven to prevent the above current consumption, the comparing unit 30A is enabled in response to the control signal in1. The driving transistor T5 of the differential amplifier 30A is enabled in response to the control signal in1.

The present invention is not limited solely to the object of measuring when a voltage level of the dummy wordline reaches a predetermined voltage level. Namely, when the first reference voltage Vref1 is variable, it is possible to determine when the voltage level of the dummy wordline reaches the first reference voltage Vref1 level. Accordingly, if a user applies a desired reference voltage Vref level, such as a 1V, 3V or Vext level, when the voltage level of the dummy wordline is higher than the reference voltage Vref level, the comparing unit 30A outputs a signal. If an analog operation of the wordline is transformed to a digital operation and a delay time from the control signal in1 to the measurement pad out2 is measured, a RC delay of the dummy wordline can be detected.

Before the dummy wordline driver is driven, data of a logic 'high' level have to be written in the dummy cell for measurement, which is carried out by the control signal in2. Namely, referring to the timing diagram of FIG. 7, when the in_test signal is at a logic 'high' level, the level of the control signal in2 is maintained at a logic 'high' level so that the NMOS transistor N4 of FIG. 4 is turned on. Accordingly, the data of a CVdd level are written in the dummy cell. When the test operation starts in response to the in_test signal, the control signal in2 is decreased to a logic 'low' level so that the NOMS transistor N4 of FIG. 4 is turned off. If the dummy wordline is enabled in response to the control signal in1, a charge sharing operation of the dummy bitline is carried out only using the capacitance of a cell, such as a normal cell.

Referring to FIG. 2 and FIG. 5, when the dummy wordline is enabled, the voltage level of the dummy bitline becomes Vblp (bitline precharge voltage)+dv (voltage added by the charge sharing) by the charge sharing operation. On the other hand, the voltage level of the dummy bitline bar is fixed at a level Vblp. When an applied second reference voltage Vref2 level is higher than that of the dummy bitline, an output signal out1 is generated. When the output signal out1 of the second comparing unit 30B reaches a logic 'low' level, the dummy bitline sense amplifier 20 is driven in response to the signal out1.

Referring to FIG. 5 and FIG. 7, the driving transistors 22A and 22B of the dummy bitline sense amplifier 20 are driven in response to the control signal in8 and a sensing operation of the dummy bitlines BL and BLb is carried out. The control signal in4 of the precharging unit 24, which maintains the voltage level of the dummy bitlines BL and BLb at a precharge voltage Vblp level, has to reach the logic 'low' level more quickly than the control signal.

When the sensing operation starts, the dummy bitline BL increases to a logic 'high' level and the dummy bitline bar BLb decreases to a logic 'low' level in order that data of a logic 'high' level can be written in the dummy cell. The third comparing unit 30C compares a dummy bitline BL voltage level with a third reference voltage Vref3 level applied from an external circuit and, when the dummy bitline BL voltage level is higher than the third reference voltage Vref3 level, the comparing unit 30C outputs signal out3.

Referring to FIG. 7, the disable time of the control signal in4 outputted from the control circuit 40 has to be later than that of the control signal in1. When the dummy bitlines BL and BLb are precharged to the precharge voltage Vblp level and the dummy wordline WL is enabled, a current path between Vblp connected by the control signal in4 and CVdd connected by the control signal in2 is generated. When the control signal in4 is disabled, the signal in_test is delayed so that the above problem is solved.

It is preferable that the first comparing unit 30A, the second comparing unit 30B and the third comparing unit 30C are configured with the same structure for sensing under identical surrounding conditions according to the present invention. The isolation transistors 26A and 26B of dummy bitline sense amplifier 20 are inserted to make the surrounding conditions identical to those of the normal bitline sense amplifier. Accordingly, the surrounding conditions between the normal bitline and the dummy bitline or the normal wordline and the dummy wordline are identified so that accurate measurement data are expected.

When the monitoring circuit is used according to the present invention, an accurate wordline or bitline RC delay and a model parameter can be measured so that a semiconductor memory device having accurate timing of its internal operation can be fabricated.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a plurality of dummy wordlines independently formed with a plurality of normal wordlines;
   a plurality of dummy wordline drivers for driving the plurality of dummy wordlines;
   a plurality of control circuits for controlling the plurality of dummy wordline drivers;
   a plurality of comparing means for comparing the voltage level of a selected dummy wordline and the level of a predetermined reference voltage and outputting signals based on comparing the voltage levels; and a plurality of outputting means for outputting the signals outputted from the plurality of comparing means.

2. The semiconductor memory device as recited in claim 1, wherein the control circuit is a timing signal generating circuit.

3. The semiconductor memory device as recited in claim 1, wherein the comparing means includes:

a differential amplifier for comparing the voltage level of the selected dummy wordline and the predetermined reference voltage level and generating an output signal based on the comparison; and a driver for amplifying the output signal of the differential amplifier.

4. The semiconductor memory device as recited in claim 1 further comprising a plurality of normal wordline drivers for driving the plurality of normal wordlines.

5. The semiconductor memory device as recited in claim 4, wherein the dummy wordline driver and the normal wordline drivers include transistors, and wherein the transistors included in the dummy wordline driver are the same size as the transistors of the normal wordline drivers.

6. The semiconductor memory device as recited in claim 5, further comprising a plurality of voltage transforming means for randomly transforming the predetermined reference voltage.

7. A semiconductor memory device comprising:

a plurality of dummy bitlines independently formed with a plurality of normal bitlines;

a plurality of dummy bitline drivers for driving the plurality of dummy bitlines;

a plurality of control circuits for controlling the plurality of dummy bitline drivers;

a plurality of comparing means for comparing the voltage level of a selected dummy bitline and the level of a predetermined reference voltage and outputting signals based on the comparing the voltage levels; and a plurality of outputting units for outputting the signals outputted from the plurality of comparing means.

8. The semiconductor memory device as recited in claim 7, wherein the control circuit is a timing signal generating circuit.

9. The semiconductor memory device as recited in claim 7, wherein the comparing means includes:

a differential amplifier for comparing the voltage level of the selected dummy bitline and the predetermined reference voltage level and outputting a signal based on the comparison; and a driver for amplifying the output signal of the differential amplifier.

10. The semiconductor memory device as recited in claim 7, further comprising a plurality of normal bitline sense amplifiers for sensing a plurality of normal bitlines.

11. The semiconductor memory device as recited in claim 10, wherein the dummy bitline sense amplifier and the normal bitline sense amplifier both include transistors, and wherein the transistors included in the dummy bitline sense amplifier are the same size as the transistors of the normal bitline sense amplifier.

12. The semiconductor memory device as recited in claim 11, further comprising a plurality of voltage transforming means capable of randomly transforming the predetermined reference voltage.

13. A semiconductor memory device comprising;

a plurality of dummy wordlines independently formed with a plurality of normal wordlines;

a plurality of normal bitlines independently formed with a plurality of normal bitlines;

a monitoring means for measuring voltage on one of a selected dummy bitline and a selected dummy wordline; and a control circuit for controlling the monitoring means.

14. The semiconductor memory device as recited in claim 13, wherein the control circuit is a timing signal generating circuit.

15. The semiconductor memory device as recited in claim 13, wherein the monitoring means includes:

a dummy wordline driver for driving a selected dummy wordline;

first comparing means for comparing the voltage level of the selected dummy wordline with a predetermined first reference voltage level and outputting signals based on comparing the voltage levels;

first outputting means for outputting signals outputted from the first comparing means;

a dummy bitline sense amplifier for amplifying data on the selected dummy bitline;

second comparing means for comparing the voltage level of the dummy bitline with a predetermined second reference voltage level; and second outputting means for outputting signals outputted from the second comparing means.

16. The semiconductor memory device as recited in claim 15, wherein the first and second comparing means include:

a differential amplifier for comparing the voltage level of the selected dummy wordline with a predetermined reference voltage level; and a driver for amplifying the output signals of the differential amplifier.

17. The semiconductor memory device as recited in claim 13, further comprising a plurality of normal wordline drivers for driving the normal wordlines.

18. The semiconductor memory device as recited in claim 17, wherein the dummy wordline drive and the normal wordline drives include transistors, and wherein the transistors included in the dummy wordline driver are the same size as the transistors of the normal wordline drivers.

19. The semiconductor memory device as recited in claim 13, further comprising a normal bitline sense amplifier for sensing the normal bitline.

20. The semiconductor memory device as recited in claim 19, wherein the dummy bitline sense amplifier and the normal bitline sense amplifier both include transistors, and wherein the transistors included in the dummy bitline sense amplifier are the same size as the transistors of the normal bitline sense amplifier.

* * * * *